(12) United States Patent
Chen et al.

(10) Patent No.: US 6,432,613 B1
(45) Date of Patent: Aug. 13, 2002

(54) PHOTOSENSITIVE COMPOSITION

(75) Inventors: Man-Lin Chen, Miaoli Hsien; Jing-Pin Pan, Hsinchu Hsien; Hsien-Kuang Lin, Taipei; Shur-Fen Liu, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/866,727

(22) Filed: May 30, 2001

(30) Foreign Application Priority Data

Nov. 3, 2000 (TW) ........................... 89123177 A

(51) Int. Cl.$^7$ ............................................. G03F 7/028
(52) U.S. Cl. ............................... 430/280.1; 430/283.1; 522/100; 522/101; 522/102; 522/103
(58) Field of Search .................. 522/102, 100, 522/101, 103; 430/280.1, 285.1, 283.1

(56) References Cited

U.S. PATENT DOCUMENTS 4,886,842 A * 12/1989 Drain et al. ................. 522/103
4,943,516 A * 7/1990 Kamayachi et al. ..... 430/280.1
5,041,519 A * 8/1991 Pan et al. ................... 528/114

OTHER PUBLICATIONS

Pan, Jing–Pin et al, "Novel Effect of Barbituric Acid on Glass Transition Temperature of Bismaleimide–Epoxy Resin Systems", Journal of Applied Polymer Science, vol. 44, 1992 (no month given), pp. 467–476.*

* cited by examiner

*Primary Examiner*—Cynthia Hamilton
(74) *Attorney, Agent, or Firm*—Birch, Stewart, Kolasch & Birch, LLP

(57) ABSTRACT

The present invention discloses a photo-sensitive composition, used as a solder resist or a photosensitive material for insulation layers in the production of printed circuit boards. The photo-sensitive composition comprises a prepolymer containing carboxylic groups and unsaturated vinyl groups; photoinitiator; unsaturated photo-monomer; and the reaction adduct of bismaleimide derivative, barbituric acid derivative and epoxy compounds. The obtained photosensitive composition exhibits high adhesion towards PI substrates, in addition, it can be developed with alkaline water. The photosensitive composition obtained in the invention is very useful in packaging substrates, such as P-BGA, T-BGA and F-CSP due to its high heat resistance and solder resistance.

43 Claims, No Drawings

PHOTOSENSITIVE COMPOSITION

BACKGROUND OF THE INVENTION

1. Field of the Invention

The present invention relates to a photosensitive composition, and more particularly to a photosensitive composition having a high resistance to heat, mainly for use in packaged circuit boards, such as P-BGA, T-BGA and F-CSP.

2. Description of the Prior Art

Circuit boards are widely used in electronic industries and the production of various kinds of electronic products. Current market trends in the electronics industry focus on decreased size and weight of circuit boards while increasing speed, capability and interconnection density. Recently there has been focus on the techniques used to manufacture high-density integrated circuit boards, for example: MCM-L, plastic ball grid array packaging(PBGA), flip-chip, and chip scale packaging.

With PBGA, for example, after a die is attached to a PBGA substrate, a series of steps, such as wiring, molding, soldering and reflowing are carried out. During the above process, local or external temperatures can reach 200° C., or even 300° C., thus the substrate material must be a resin having high glass transition temperature (Tg), a low heat swelling coefficient, low moisture absorbency, low dielectric properties, and high reliability. The photosensitive solder resist used in the substrate material must be highly adhesive, insulating, resistant to solder temperature, solvent-resistant, corrosion-resistant, plating-resistant, and singularly resistant to heat, pressure cooker, and thermal cycle tests.

Examples of conventional photosensitive solder resist material are disclosed in U.S. Pat. Nos. 5,100,767 and 4,943,516, wherein coating polymers containing carboxylic groups and multiple alkene unsaturated bonds, photosensitive monomers, photoinitiators and epoxy resins are subsequently photo-cured, developed with alkali water and heat-cured to be used in conventional printed circuit boards.

Moreover, U.S. Pat. No. 5,041,519 discloses that a modified PI resin has a high workability, a high rigidity, and good compatibility with epoxy resin. It is also highly resistant to heat and has a high glass transition temperature. In addition, U.S. Pat. No. 4,886,842 discloses that by adding bismaleimide in a photosensitive material containing epoxy resin and acrylic monomers, significant improvement in the reliability of TCT is observed. However, it is mainly used as adhesive clay for electronics devices and is a fully disposed type of resin. Hence, it cannot be developed to form images.

SUMMARY OF THE INVENTION

To overcome these problems, the invention provides a photosensitive composition having enhanced heat resistance that can be used in manufacturing MCM-L, plastic ball grid array packaging, flip-chip, and chip scale packaging. The photosensitive composition comprises:

(a) a prepolymer, containing a carboxyl group and an unsaturated vinyl group;

(b) a photoinitiator;

(c) an unsaturated photomonomer; and (d) adduct of reacting bismaleimide derivative, a barbituric acid derivative, and an epoxy.

The above photosensitive composition undergoes processes, such as coating, drying, disposing, developing etc. to form patterns of photosensitive material on printed circuit boards.

The photosensitive composition with high resistance to heat of the invention has high adhesion with PI substrates. As well, it can be developed with alkali solutions. Having met the requirements of a highly heat-resistant solder resist material, the photosensitive composition of the invention can be used in package substrates, such as P-BGA, T-BGA, F-CSP. It also can be used as a photosensitive insulation layer.

DETAILED DESCRIPTION OF THE INVENTION

The following will further explain the photosensitive composition of the invention.

The photosensitive composition of the invention is comprised of a prepolymer containing a carboxyl group and an unsaturated vinyl group; photoinitiator; unsaturated photomonomer; and the reaction adduct of bismaleimide derivative, barbituric derivative and epoxy compound. Suitable solvents can be added as diluents.

The above prepolymer is selected from the group consisting of complete esterification products formed by the esterification of a novolak type epoxy compound with an unsaturated monocarboxylic acid; reaction products obtained by causing the secondary hydroxyl group of the esterification product resulting from said esterification to react with a saturated or unsaturated polybasic acid anhydride.

As the novolak type epoxy compounds described above, those which are obtained by the reaction of epichlorohydrin and/or methyl epichlorohydrin with novolaks resulting from the reaction of such phenols as phenol, cresol, halogenated phenol, and alkylphenol with formaldehyde in the presence of an acidic catalysts are particularly suitable. Examples of such suitable novolak type epoxy compounds are as follows: "Epo Tohto" YDCN-701, YDCN-704, YDPN-638 and YDPN-602 available from Tohto Kasei Company Ltd.; "D.E.N"-431 and -439 available from The Dow Chemical Company; "ARALDITE" EPN-1138, -1235, and -1299 available from Ciba-Geigy Ltd.; "EPICLON" N-730, -770, -865, -665, -673 and -695, and "PLYOPHEN" VH-4150, -4240, and -4440 available from Dainippon Ink and Chemicals Inc.; "EOCN" -120 and -104 , and "BRRN"-1020 available from Nippon Kayaku Company Ltd.; and "AER" ECN-265, -293, -285, and -299 available from Asahi Chemical Industry Company Ltd.. Optionally, the novolak type epoxy compounds may be partially or completely substituted with bisphenol A type, bisphenol F type, hydrogenated bisphenol A type, brominated bisphenol A type, amino group-containing, alicyclic, or polybutadiene modified glycidyl ether epoxy compounds, such as "EPIKOTE" -828, -1007 and -807 available from Yuka Shell Epoxy Kabushiki Company; "EPICLON" -840, -860, -3050, and -830 available from Dainippon Ink and Chemicals Inc; "D.E.R." -330, -337 and -361 available from The Dow Chemical Company; "Celloxide" 2021 and 3000 available from Daicel Chemical Industries Ltd.; "TETRAD"-X and -C available from Mitsubishi Gas Chemical Company Inc.; "NISSO EPOXYN" EPB-13 and -27 available from Nippon Soda Company Ltd.; "Epo Tohto" YD-116, -128, -013, and -020, YDG-414, YDF-190, -2004, and -2007 available from Tohto Kasei Company Ltd.; ST-3000 and -110 available from Sun Tohto; "ARALDITE" GY-260, -255, XB-2615 available from Ciba Geigy Ltd.; "D.E.R" -332, -662 and -542 available from Dow Chemical Company. Among these, the cresol novolak type epoxy compounds are particularly desirable.

The unsaturated monocarboxylic acids used are, for example, acrylic acid, methacrylic acid, beta-styryl acrylic acid, beta-furfuryl acrylic acid, crotonic acid, alpha-cyanocinnamic acid, cinnamic acid, half esters of saturated or unsaturated dibasic acid anhydrides with (meth)acrylates possessing one hydroxyl group in the molecular unit thereof, such as, for example, half esters obtained by causing such saturated or unsaturated dibasic acid anhydrides of phthalic acid, tetrahydrophthalic acid, hexahydrophthalic acid, maleic acid, succinic acid, itaconic acid, chlorendic acid, methylhexahydrophthalic acid, methylendomethylene tetrahydrophthalic acid, and methyltetrahydrophthalic acid to react in equimolar ratio with hydroxyethyl acrylate, hydroxypropyl acrylate, hydroxybutyl acrylate, polyethylene glycol monoacrylate, glycerin diacrylate, trimethylol propane diacrylate, pentaerythritol triacrylate, dipentaerythritol pentacrylate and diacrylate of triglycidyl isocyanurate or with methacrylates corresponding to the acrylate enurerated above, and half esters of saturated or unsaturated dibasic acid anhydrides with unsaturated monoglycidyl compounds obtained by causing the saturated or unsaturated dibasic acids mentioned above to react similarly with glycidyl (meth)acrylate by the conventional method. These are used either singly or in a mixture of two or more constituents. Among other unsaturated monocarboxylic acids mentioned above, acrylic acid is preferable.

The saturated or unsaturated polybasic acid anhydrides described above may be, for example, the anhydrides of phthalic acid, tetrahydrophthalic acid, hexahydrophthalic acid, maleic acid, succinic acid, itaconic acid, chlorendic acid, methylhexahydrophthalic acid, methylendomethylenete-tetrahydrophthalic acid, methyltetrahydrohthalic acid, trimellitic acid, pyromellitic acid, or benzophenone tetracarboxylic acid. Among other anhydrides listed above, tetrahydrophthalic acid anhydride or hexahydrophthalic acid anhydride are preferable.

The prepolymer used in the invention can also be obtained from the reaction of styrene-maleic anhydride resin with the following two compounds:
  i. unsaturated alcohols containing at least three acrylic groups in each molecule; and
  ii. saturated alcohols.

The styrene-maleic anhydride is obtained by the copolymerization reaction of styrene and maleic anhydride. Because there is still anhydride group present in the resin, it is able to undergo a ring-opening, or esterification reaction with alcohols, introducing an hydroxyl group to the side chain.

The amount of styrene-maleic anhydride can be adjusted by the ratio of styrene to maleic anhydride. The number of the repeating unit is from about 1:1 to 3:1. The higher the relative amount of styrene, the harder the modified resin will be, however, the amount of substitution group elements is reduced. When the ratio of repeating units is greater than 1:1, the more the unsaturated double bond is introduced, which in turn, increases the degree of crosslinking and photosensitivity. Moreover, the more of the hydroxyl group that is introduced, the easier the development of the photosensitive layer will be. But more hydroxyl groups do not guarantee the improvement of resolution or adhesion. A suitable ratio of amount and other additives used must be employed. The preferable molecular weight of styrene-maleic anhydride is between 800 and 100000. When the molecular weight is lower than 800, film formation is poor, and there will be problems of absorption and pollution of the dispouser film after drying and exposure. On the other hand, when the molecular weight is greater than 100000, problems such as unclean development will occur. Suitable styrene-maleic anhydride is selected from SMA1000, SMA2000 and SMA3000 (the repeating unit of styrene and maleic anhydride is 1:1, 2:1 and 3:1 respectively; available from ATO company).

The main function of the unsaturated alcohols is to provide an unsaturated double bond for the film-forming polymer. Also, by having at least three acrylic groups in each molecule, after it is reacted with the anhydride group, enough unsaturated vinyl groups are introduced in the side chain of the styrene-maleic anhydride. This will enhance the degree of crosslinking and photosensitivity of the photosensitive composition. Suitable unsaturated alcohol is selected from low volatile alcoholes, such as pentaerylthritol triacrylate (PETA) and dipentaerylthritol pentacrylate (DPPA). Between them, DPPA is able to introduce more double bonds. Therefore, it has higher photosensitivity, but the film formed is softer. PETA, however is able to form harder polymer, because it has a lower molecular weight. After grafting, the side chain is shorter, which increases the hardness of the polymer. Due to the high demand of hard solder resist material, PETA is preferable. In styrene-maleic anhydride, the ratio of the anhydride group and the hydroxyl group of unsaturated alcohol is preferably between 1:0.05 and 1:0.9, most preferably between 1:0.2 and 1:0.7. When unsaturated alcohol is used excessively, the hardness of the coating tends to be insufficient. If the amount of the unsaturated alcohol is deficient, the double bond is inadequate, lowering photosensitivity.

The main function of the saturated alcohol is to participate in the ring-opening reaction, and introduce a sufficient number of hydroxyl groups in the side chain of the film-forming polymer. The structure of general saturated alcohol is not limited, as long as it is not an irritant. Examples are alkyl alcohol, such as ethanol, n-propanol, iso-propanol, n-butanol, sec-butanol, iso-butanol, n-pentanol, 2-methyl-1-butanol, isopentyl alcohol, n-hexyl alcohol, n-heptyl alcohol, n-octyl alcohol, cyclopentanol and cyclohexanol, and ether alcohols such as ethylene glycol monomethyl ether, ethylene glycol monoethyl ether, ethylene glycol monobutyl ether, carbitol, propyleneglycol monomethyl ether and dipropyl diol methyl ether. The amount and the size of molecules of the above saturated alcohols will affect the number of hydroxyl groups and hardness of the film-forming polymer. Generally, the more saturated alcohol that is used, the higher the ratio of the anhydride ring-opening will be, which results in easier development of the photosensitive material. Preferably, the equivalent amount of the anhydride and the saturated alcohol is between 1:0.2 and 1:10. The size of the molecules of the saturated alcohol will affect the distance between the chains of the molecules. Usually, the less saturated alcohol is used, the harder the film gets. Before exposure, if the film is too hard, it is unfavorable to photosensitivity. The amount and size of the saturated alcohol molecules used relates to acid value and degree of hardness. In addition, the two properties also relate to other additives.

The photoinitiator used in the photosensitive composition of the invention is not limited. For use with liquid photosensitive material, however, preferably with high light-absorbing decomposition, reducing the crosslinking problem on surfaces caused by the suppression of oxygen. Suitable photoinitiators are selected from 2-dimethoxy-2-benzil dimethyl ketal, 2,4-diethylthioxanthone, isopropylthioxanthone, 2-methyl-1-(4-(methyl-thio)phenol)-2-morpholinopropanone-1), benzophenone etc. To enhance photosensitivity, 2-dimethylaminoethyl benzoate, ethyl(p-dimethylaminio)benzoate or Michler's ketone can be added.

Unsaturated photo-chained monomers are able to provide a double bond for polymerization when the photosensitive composition is under UV exposure. The more unsaturated double bonds in a molecule, the more chains are formed. Suitable photo-chained monomers are selected from trimethylolpropane triacrylate, pentaerythritol triacrylate, pentaerythritol tetracrylate, dipentaerythritol pentacrylate, dipentaerythritol hexacrylate, bis-phenol A type epoxy acrylate and urethane acrylate. The above compounds are used alone or in a mixture of more than two. The variety and the amount added depend on the softness of the coating.

The component d of the photosensitive composition of the invention is an adduct which is the reaction product of bismaleimide derivative, barbituric acid derivative and an epoxy. The formula of bismaleimide is shown as below:

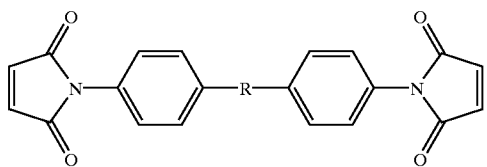

wherein R represents an aromatic group, aliphatic group or alicyclic group. The barbituric acid or its derivatives of the invention have the formula:

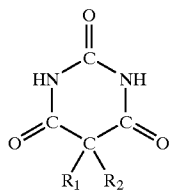

wherein $R_1$ and $R_2$ are hydrogen or alkyl groups, such as —H, —$CH_3$, —$C_6H_5$, $CH(CH_3)_2$—, $CH_2CH_2CH(CH_3)_2$, and

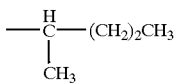

And the epoxy resin used is a finely powdered epoxy compound possessing at least two epoxy groups in each molecule.

The finely powdered epoxy compound possessing at least two epoxy groups in each molecule used in the invention is any epoxy compound conventionally used. However, the epoxy compound must be capable of being dispersed in a finely powdered form in the photosensitive polymer (a) possessing at least two ethylenically unsaturated bonds in each molecule and is further required to assume a solid or semisolid state at ambient temperature. In addition, it is required to be insoluble in the photosensitive polymer (a) and the diluent (c) used must have no adverse effects upon photosensitivity and developing properties. The epoxy compounds satisfying these requirements are bisphenol S type epoxy resins represented by the products of: Nippon Kayaku Co., Ltd. under registered trademark designation of EBPS"-200, that of Asahi Denka Kogyo Co., Ltd. under the trademark of "EPX"-30, and that of Dainippon Ink and Chemicals, Inc under trademark of "EPOCLON" EXA-1514; diglycidyl phthalates represented by the product of Nippon Oil and Fats Co., Ltd. under the trademark of "BLEMMER"-DGT; heterocyclic epoxy resins represented by the product of Nissan Chemical Industries, Ltd. under the product code of TEPIC and that of Ciba-Geigy Ltd, under trademark of "ARALDITE" PT 810; bixylenol type epoxy resins represented by the product of Yuka Shell Epoxy Kabushiki Kaisha under trademark of "EPIKOTE" YX04000; biphenol type epoxy resins represented by the product of Yuka Shell Epoxy Kabushiki Kaisha under trademark of "EPIKOTE" YL-6056; and tetraglycidyl xylenoyl ethane resins represented by the product of Tohto Kasei Co., Ltd. under product code of "ZX-1063".

In addition, an epoxy compound such as a bisphenol A type epoxy resin or bisphenol F type epoxy resin which exhibits solubility to said diluent and possesses at least two epoxy groups in the molecular unit thereof may be used in place of part of the sparingly soluble epoxy compound (D) to such an extent that the substitution brings about practically no problem in terms of photosensitivity and solubility of the unexposed part in the developing solution. Desirably, the amount of the soluble epoxy compound (S) to be used for substitution is such that the ratio of the soluble epoxy compound (S) to the sparingly soluble epoxy compound (D), S:D is in the range of 0–60:100–40, preferably 0–40:100–60, and more preferably 0–30:100–70 and the ratio of the soluble epoxy compound (S) to the photosensitive polymer (a) is not higher than 25:75, preferably lower than 20:80. If the latter ratio is higher than 25:75, the unexposed part of the composition exhibits unduly low solubility in the developing solution and suffers part thereof to survive the development where the development is affected with an alkalined developing solution and the composition is corroded with the developing solution and the coating tends to suffer from separation or blistering and becomes nearly unusable where the development is influenced by a solvent-type developer. The additional use of the soluble epoxy compound produces the effect of enhancing part of the characteristic properties of solder resist such as resistance to plating.

Examples of the soluble epoxy compound (S) are bisphenol A type epoxy resins represented by the products of Yuka Shell Epoxy Kabushiki Kaisha under trademark of "EPIKOTE" 1009 and 1031, those of Dainippon Ink and Chemicals Inc. under trademark of "EPICLON" N-3050, -7050, and -9050, those of Asahi Chemical Industry Co., Ltd, under trademark of "AER" -664, -667, and -669, those of Tohto Kasei CO., Ltd. under trademark of "Epo Tohto" YD-012, -017, -014, -020, and -002, those of Ciba-Geigy Ltd. under trademark of "ARALDITE" XAC-5005, GT-7004, -6484T, and -6099; those of the Dow Chemical Company under trademark kof "DER" -642U and -673MF, those of Asahi Denka Kogyo Co., Ltd. under trademark of "EP" -5400 and -5900; hydrogenated bisphenol A type epoxy resins represented by the products of Tohto Kasei Co., Ltd. under trademark of "Sun Tohto" ST-2004 and -2007; bisphenol F type epoxy resins represented by the products of Tohto Kasei Co., Ltd. under trademark of "Epo Tohto" YDF-2004 and -2007; brominated bisphenol A type epoxy resins represented by the products of Sakamoto Yakuhin Kogyl CO., Ltd under product code of SR-BBS and SR-TBA-400, those of Asahi Denka Kogyl Co., Ltd. under product codes of EP-62 and -66, those of Asahi Chemical Industry Co., Ltd. under trademark of "AER"-755 and -765, and Tohto Kassei Co., Ltd. under trademark of "Epo-Tohto" YDB-600 and -715; novolak type epoxy resins such as the products of Nippon Kayaku Co., Ltd. under trademark of "EPPN"-201, "EOCN"-103, -1020, and -1025, and "BREN", those of Asahi Chemical Industry Co., Ltd. under trademark okf "AER" ECN-278, -292, and -299, those of Ciba-geigy Ltd. under trademark of "ARALDITE" ECN-1273 and -1299, those of Tohto Kasei Co,. Ltd. under trademark of "Epo Tohto" YDCN-220L, -220HH, -702, and -704, and YDPN-601 and -602, and those of Dainippon Ink and Chemicals Inc. under trademark of "EPICLON" N-673, -680, -695, -770, and -775; novolak type epoxy resins of bisphenol A represented by the product of Asahi Denka Kogyo CO., Ltd. under trademark of "EPX"-8001 and -8002 and "EPPX"-8060 and -8061 and the product of Dainippon Ink and Chemicals, Inc. under trademark okf "EPICLON" N-880; chelate type epoxy resins represented by the products of Asahi Denka Kogyl Co., Ltd. under trademark of "EPX"-49-60 and -49-30; glyxal type epoxy resins represented by the product of Tohto Kasei Co., Ltd. under trademark of "Epo Tohto" YDG-414; amino group-containing epoxy resins represented by the products of Tohto Kassei Co., Ltd. under trademark of "Epo Tohto" YH-1402 and "Sun Tohto" ST-110 and Yuka Shell Epoxy Kabushiki Kaisha under trademark of "EPIKOTE" YL-931 and -933; rubber-modified epoxy resins represented by the product of Dainippon Ink and Chemicals, Inc. under trademark of "EPICLON" TSR-601 and the products of Asahi Denka Kogyo Co., Ltd. under trademark of "EPX" -84-2 and -4061; dicyclopentadiene phenolic type epoxy resins represented by the product of Sanyo-Kokusaku Pulp Co., Ltd. under trademark of "SK RESIN" DCE-400; silicone-modified epoxy resins represented by the product of ACR Company Ltd. under product code of X-1359; and xi-caprolactone-modified epoxy resins represented by the products of Daicel Chemical Industries Ltd. under product code of Placel G-402 and G-710. Further, partial esterification products of the aformentioned epoxy compounds (D) and (S) with (meth)acrylic acid are also suitable for the substitution.

The manufacturing procedure of this resin may be divided into two steps:

Step I: Add a suitable amount of barbituric acid or its derivative to bismaleimide resin. The weight ratio of bismaleimide and barbituric acid or its derivative is in the range of 3:1 to 20:1, preferably 5:1 to 10:1. After adding suitable solvent or solvent system and mixing completely, the mixture should be heated and kept at 120~145° C. for 0.5 to 1.5 hours.

Step II: Add epoxy resin to the bismaleimide resin mixture and mix it completely. The weight ratio of bismaleimide derivative and barbituric acid derivative to epoxy is in the range of 1:2 to 1:5 and preferably 1:3 to 1:4. The mixture is then agitated at 70~125° C. for 0.5~1.5 hours. Then cooling and stirred to room temperature.

In addition, the photosensitive polymer (a) to the reaction product of a bismaleimide derivative, a barbituric acid derivative and an epoxy is in the range of 1:1.4 to 1:0.1.

In order to promote the thermal hardening characteristics of the epoxy resin, curing agents are added. Suitable curing agents preferably do not cause thermal polymerization of the epoxy resin when baked to 80° C. However, the reaction of epoxy resin should be induced when baked at post bake temperature. Curing agents that meet the above requirements are, for example, imidazole, 2M4FZ, 2P4M5FZ, 2PHZ, 2PZ, 2P4MZ, 2PZL from Shikku Chemical Co.; and dicyandiamide.

Apart from the above components, other additives can be added to the photosensitive composition, such as fillers, solvents, dispersion agents, anti-sagging agents, defoamer, leveling agent, dyes or pigments, thermal inhibitor and flame retardant etc.

When additives, curing agents or pigments are added to the photosensitive composition, the mixture must be ground into fine powder to increase the flatness and burnish of the coating. The mostly commonly used grinder is a triple-roll mill. When manufacturing thermosetting liquid solder resist, the epoxy resin and coat-forming polymer are separately mixed with respective curing agents. The main agent and curing agent are also separately ground and stored, and are combined immediately prior to mixing.

The application of the liquid photosensitive composition onto the printed circuit board is usually performed by screen printing or curtain coating. After being prebaked at around 75~80° C., it is UV exposed at 500~600 mJ/cm$^2$. Sodium carbonate solution is then used to develop the photosensitive layer. For the manufacturing of the solder resist, the exposed photosensitive layer must be post baked at about 180° C. for 40~60 minutes to completely cure the photosensitive layer. The post baked solder resist exhibits excellent curing and hardness enough to stand the etching of the follow-up soldering and electroplating. For the manufacture of a photosensitive insulation layer with small diameter windows, the exposed photosensitive layer must be post baked at 180° C. for 60~90 minutes to completely cure the photosensitive layer, followed by non-electrical plating and electroplating etc.

EMBODIMENTS

Synthesis of Prepolymer

Binder (I)

1000.0 g of diethyleneglycol monoethylether acetate was added to a vessel with four holes. The temperature was raised to 105, and 1150 g of ECN1299 (available from Ciba-Geigy Ltd.) was then added slowly to the vessel. The reactant was stirred until the powder was completely dissolved. 0.5 g of hydroquinone, 8.5 g of N,N-dimethylaminopyridine and 420.0 g of acrylic acid were added. The reaction continued for 12 hours, followed by the addition of 494 g of tetrahydrophthalic acid anhydride. After a further eight hours of reaction, 114.0 g of Naphtha 150 was added to dilute the reaction product and a resin solution binder (I) was obtained.

Binder (II)

820.0 g of diethyleneglycol monoethylether acetate was added to a vessel with four holes. The temperature was raised to 105, and 1165 g of SMA1000 (available from Ato Co. styrene:maleic anhydride=1:1) was then added slowly in the vessel. The reactant was continually stirred until the powder was completely dissolved. 0.5 g of hydroquinone, 8.5 g of N,N-dimethylaminopyridine and 596.0 g of pentaerythritol triacrylate were added. The reaction continued for 6 hours followed by the addition of 136 g of ethanol. After 8 hours further reaction, 202.0 g of Naphtha 150 was added to dilute the reaction product and a resin solution binder (II) was obtained.

Resin 1

10.2 g of N,N'-4,4'-diphenylmethane-bismaleimide was dissolved in 30g of N-methyl-2-pyrrolidone, and then 1.79 g of barbituric acid was added. The mixture was heated and stirred at 130° C. for 1 hour. Subsequently, 25 g of epoxy resin (5 g of YDCN-704 from South Asia, 15 g of PT-810 from Ciba-Geigy Co. and 5 g of brominated bis-phenol A epoxy) was heated to 130° C. and added to the mixture. After continuous mixing and heating at 130° C. for 1 hour, the temperature was reduced to 60° C. Finally 5 g of acetone and 5 g of methyl ethyl ketone were added to the resin mixture. After stirring at 60° C. for 30 minutes, the mixture was cooled and stirred to room temperature. A high performance resin composition was obtained.

Resin 2

10.2 g of N,N'-4,4'-diphenylmethane-bismaleimide was dissolved in 30 g of N-methyl-2-pyrrolidone, and then 1.79 g of barbituric acid was added. The mixture was heated and stirred at 130° C. for 1 hour. Subsequently, 35 g of epoxy resin (10 g of EPON1001 from Shell Co., 20 g of YX4000 from Shell Co. and 5 g of brominated bis-phenol A epoxy) was heated to 130° C. and was added to the mixture. After continuous mixing and heating at 130° C. for 1 hour, the temperature was reduced to 60. Finally 5 g of acetone and 5 g of methyl ethyl ketone was added to the above resin mixture. After stirring at 60° C. for 30 minutes, the mixture was cooled and stirred to room temperature. A high performance resin composition was obtained.

Resin 3

10.2 g of N,N'-4,4'-diphenylmethane-bismaleimide was dissolved in 30 g of N-methyl-2-pyrrolidone, and then 1.79 g of barbituric acid was added. The mixture was heated and stirred at 130° C. for 1 hour. Subsequently, 20 g of epoxy resin (5 g of YDCN-704 from South Asia Co., 10 g of EPON 1001 from Shell Co. and 5 g of brominated bis-phenol A epoxy) was heated to 130 and added to the mixture. After continuous mixing and heating at 130° C. for 1 hour, the temperature was reduced to 60° C. . Finally 5 g of acetone and 5 g of methyl ethyl ketone were added to the resin mixture. After stirring at 60° C. for 30 minutes, the mixture was cooled and stirred to room temperature. A high performance resin composition was obtained.

1$^{st}$ Embodiment

The following main agent and curing agent were prepared and mixed, followed by grinding by a triple-roll mill.

| | (g) |
|---|---|
| Main agent | |
| Binder I | 153.0 |
| 2-methyl-1-(4-(methylthio)phenyl)-2-morpholinopropanone-1 | 6.0 |
| dimethylbenzyl ketal | 2.0 |
| 2-dimethylaminoethyl benzoate | 1.5 |
| Dipentaerythritol hexacrylate | 15.0 |
| BaSO$_4$ | 50.0 |
| SiO$_2$ | 20.0 |
| Aerosil-200 | 2.0 |
| Modaflow 2100 | 1.0 |
| Defoamer DC-1000 (Deuchem Trading Co.) | 1.5 |
| Dicyandiamid | 2.0 |
| Pigment green-36 | 1.2 |
| Piqment green-7 | 1.0 |
| Hydroquinone | 0.2 |
| Curing agent | |
| Resin I | 77 |
| dipentaerythritol hexacrylate | 5.0 |
| aerosil-200 | 1.0 |
| BaSO$_4$ | 10.0 |
| Napha-150 (From China Petroleum Co.) | 5.0 |

The main agent and the curing agent were mixed and stirred completely. The photosensitive composition was then applied to a printed circuit board with metal wires by screen coating. The printed circuit was then placed in an oven and baked at 80° C. for 30 minutes. After cooling, a film was applied to the printed circuit board, followed by UV exposure at 500 mJ/cm$^2$. 1.0% Na$_2$CO$_{3(aq)}$ was then used to develop and expose the area to be coated with solder. The circuit board was then placed in a 180° C. oven to cure for 60 minutes. The cured solder resist was then tested with CH$_2$Cl$_2$, 10% NaOH(aq) and 10% HCl$_{(aq)}$ for chemical resistance, hardness and adhesion tests. The result is shown in Table 1.

2$^{nd}$ Embodiment

The following main agent and curing agent were prepared and mixed, followed by grinding by a triple-roll mill.

| | (g) |
|---|---|
| Main agent | |
| Binder I | 153.0 |
| 2-methyl-1-(4-(methylthio)phenyl)-2-morpholinopropanone-1 | 5.0 |
| 2-dimethylaminoethyl benzoate | 1.5 |
| Dipentaerythritol hexacrylate | 25.0 |
| BaSO$_4$ | 25.0 |
| Talc | 10.0 |
| Aerosil-200 | 1.5 |
| Modaflow 2100 | 1.0 |
| Defoamer DC-1000 (Deuchem Trading Co.) | 1.0 |
| Dicyandiamide | 1.0 |
| 2-phenyl-4,5-dihydroxy-methylimidazole (2PHZ) | 1.3 |
| Pigment green-36 | 1.2 |
| Pigment green-7 | 1.0 |
| hydroquinone | 0.2 |
| curing agent | |
| Resin 2 | 87 |
| Dipentaerythritol pentacrylate | 5.0 |
| aerosil-200 | 1.0 |
| BaSO$_4$ | 20.0 |
| Napha-150 (from China Petroleum Co.) | 5.0 |

The main agent and the curing agent were mixed and stirred completely. The photosensitive composition was then applied to a printed circuit board with metal wires by screen coating. The printed circuit was then placed in an oven and baked at 80° C. for 30 minutes. After cooling, a film was applied to the printed circuit board, followed by UV exposure at 500 mJ/cm$^2$. 1.0% Na$_2$CO$_{3(aq)}$ was then used to develop and expose the area to be coated with solder. The circuit board was then placed in a 180° C. oven to cure for 60 minutes. The cured solder resist was then tested with CH$_2$Cl$_2$, 10% NaOH$_{(aq)}$ and 10% HCl$_{(aq)}$ for chemical resistance, hardness and adhesion tests. The result is shown in Table 1.

3$^{rd}$ Embodiment

The following main agent and curing agent were prepared and mixed, followed by grinding by a triple-roll mill.

| | (g) |
|---|---|
| Main agent | |
| Binder I | 153.0 |
| 2-methyl-1-(4-(methylthio)phenyl)-2-morpholinopropanone-1 | 6.0 |
| 2-dimethylaminoethyl benzoate | 1.5 |
| Dipentaerythritol pentacrylate | 20.0 |
| BaSO$_4$ | 30.0 |

-continued

|  | (g) |
|---|---|
| SiO$_2$ | 5.0 |
| Aerosil-200 | 3.0 |
| Modaflow 2100 | 1.0 |
| Defoamer DC-1000 (Deuchem Trading Co.) | 1.0 |
| dicyandiamide | 0.5 |
| 2-phenyl-4,5-dihydroxy-methylimidazole (2PHZ) | 2.0 |
| Pigment green-36 | 0.1 |
| Pigment green-7 | 0.6 |
| hydroquinone | 0.2 |
| Curing agent | |
| Resin 3 | 72 |
| pentaerythritol triacrylate | 5.0 |
| aerosil-200 | 0.5 |
| BaSO$_4$ | 10.0 |
| Napha-150 (from China Petroleum Co.) | 10.0 |

The main agent and the curing agent were mixed and stirred completely. The photosensitive composition was then applied to a printed circuit board with metal wires by screen coating. The printed circuit was then placed in an oven and baked at 80° C. for 30 minutes. After cooling, a film was applied to the printed circuit board, followed by UV exposure at 500 mJ/cm$^2$. 1.0% Na$_2$CO$_{3(aq)}$ was then used to develop and expose the area to be coated with solder. The circuit board was then placed in a 180° C. oven to cure for 60 minutes. The cured solder resist was then tested with CH$_2$Cl$_2$, 10% NaOH$_{(aq)}$ and 10% HCl$_{(aq)}$ for chemical resistance, hardness and adhesion tests. The result is shown in Table 1.

1$^{st}$ Comparative Embodiment

|  | (g) |
|---|---|
| Main agent | |
| Binder I | 153.0 |
| 2-methyl-1-(4-(methylthio)phenyl)-2-morpholinopropanane-1 | 6.0 |
| Dimethylbenzyl ketal | 2.0 |
| 2-dimethylaminoethyl benzoate | 1.5 |
| Dipentaerythritol hexacrylate | 15.0 |
| BaSO$_4$ | 50.0 |
| SiO$_2$ | 20.0 |
| Aerosil-200 | 2.0 |
| Modaflow 2100 | 1.0 |
| Defoamer DC-1000 (Deuchem Trading Co.) | 1.5 |
| Dicyandiamide | 2.0 |
| Pigment green-36 | 1.2 |
| Pigment green-7 | 1.0 |
| hydroquinone | 0.2 |
| Carbitol acetate | 10.0 |
| Curinq agent | |
| YDCN-7-4 (South Asia) | 5.0 |
| PT-810 (Ciba-Geigy Co.) | 15.0 |
| Brominated bisphenol A epoxy | |
| Dipentaerythritol hexacrylate | 5.0 |
| aerosil-200 | 1.0 |
| BaSO$_4$ | 10.0 |
| Napha-150 (from China Petroleum Co.) | 5.0 |

The main agent and the curing agent were mixed and stirred completely. The photosensitive composition was then applied to a printed circuit board with metal wires by screen coating. The printed circuit was then placed in an oven and baked at 80° C. for 30 minutes. After cooling, a film was applied to the printed circuit board, followed by UV exposure at 500 mJ/cm$^2$. 1.0% Na$_2$CO$_{3(aq)}$ was then used to develop and expose the area to be coated with solder. The circuit board was then placed in a 180° C. oven to cure for 60 minutes. The cured solder resist was then tested with CH$_2$Cl$_2$, 10% NaOH$_{(aq)}$ and 10% HCl$_{(aq)}$ for chemical resistance, hardness and adhesion tests. The result is shown in Table 1.

TABLE 1

| Embodiment | 1 | 2 | 3 | comparative 1 |
|---|---|---|---|---|
| Resolution ($\mu$m) | 50 | 50 | 50 | 50 |
| Solvent resistance (CH$_2$Cl$_2$) | $\geq$10 min | $\geq$10 min | $\geq$10 min | $\geq$10 min |
| Chemical resistance (10% NaOH) | $\geq$10 min | $\geq$10 min | $\geq$10 min | $\geq$10 min |
| Chemical resistance (10% HCl) | $\geq$10 min | $\geq$10 min | $\geq$10 min | $\geq$10 min |
| Hardness | 6H | 6H | 6H | 6H |
| Solder resistance @ 260° C. (sec) | >400 | >450 | >300 | 100 |

From Table 1, it is shown that the photosensitive composition of the invention exhibits excellent solder resistance compared to the comparative embodiment. As a result, the photosensitive composition of the invention exhibits excellent heat resistance in comparison to the prior art.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A photosensitive composition, comprising:

(a). a prepolymer, containing a carboxyl group and an unsaturated vinyl group;

(b). a photoinitiator;

(c). an unsaturated photomonomer; and (d). adduct of reacting bismaleimide derivative, a barbituric acid derivative, and an epoxy.

2. The composition as claimed in claim 1, wherein the adduct is obtained by the reaction of the following:

a. dissolving a bismaleimide in a solvent or a solvent system, then a barbituric acid or its derivative is added to form a mixture;

b. heating the obtained mixture to 115~145° C. to form a bismaleimide resin mixture; and c. adding an epoxy resin to the resin mixture to form a resin system.

3. The composition as claimed in claim 1, wherein the composition further include organic solvents as diluents.

4. The composition as claimed in claim 1, wherein the formula of the barbituric acid or its derivative follows:

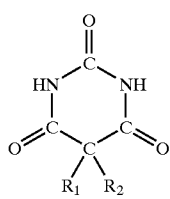

wherein $R_1$ and $R_2$ represent hydrogen, alkyl or phenyl.

5. The composition as claimed in claim 2, wherein the formula of the bismaleimide follows:

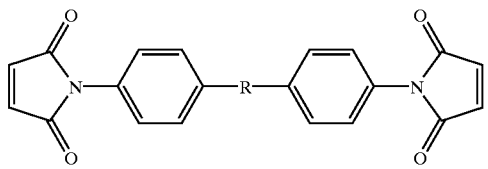

wherein R represent —$CH_2$— or —O—.

6. The composition as claimed in claim 2, wherein the epoxy resin is a finely powdered epoxy compound, and each molecule includes at least 2 epoxy groups, having minor dissolubity in the diluent used.

7. The composition as claimed in claim 6, wherein the finely powdered epoxy compound is at least one compound selected from compounds that are solid or semi-solid at room temperature, such as bisphenol S type epoxy resin, diglycidyl phthalate resin, heterocycloepoxy resin, bixylenol resin, bisphenol epoxy resin and tetraglycidyl xylenol ethane resin.

8. The composition as claimed in claim 5, wherein part of the finely powdered epoxy compound with minor dissolubity is substituted with soluble epoxy compound wherein each molecule contains at least 2 epoxy groups.

9. The composition as claimed in claim 8, wherein the mixing ratio of the finely powdered epoxy compound with minor dissolubility and the soluble epoxy compound is between 1:1.5 and 1:0 (based on weight).

10. The composition as claimed in claim 2, wherein the weight ratio of the bismaleimide derivative and the barbituric acid derivative is between 3:1 and 20:1.

11. The composition as claimed in claim 10, wherein the weight ratio of the bismaleimide derivative to the barbituric acid derivative is between 5:1 and 10:1.

12. The composition as claimed in claim 2, wherein the weight ratio of the bismaleimide derivative and the barbituric acid derivative to the epoxy resin is between 1:2 and 1:5.

13. The composition as claimed in claim 12, wherein the weight ratio of the bismaleimide derivative and the barbituric acid derivative to the epoxy resin is between 1:3 and 1:4.

14. The composition as claimed in claim 13, wherein the weight ratio of the prepolymer and the bismaleimide derivative to the barbituric acid derivative and the epoxy resin is between 1:1.4 and 1:0.1.

15. The composition as claimed in claim 1, wherein the prepolymer is selected from the complete esterification product of a novolak epoxy compound and an unsaturated monocarboxylic acid, and is the product of reacting the secondary hydroxyl group of the esterification product with a saturated or an unsaturated polybasic anhydride.

16. The composition as claimed in claim 1, wherein the novolak epoxy compound is cresol novolak epoxy compound.

17. The composition as claimed in claim 15, wherein the esterification product is the complete esterification product obtained by reacting the novolak type epoxy compound and the unsaturated monocarboxylic acid in a relative amount such that the ratio of the equivalent number of the epoxy group to that of the carboxyl group is in the range of 0.8 to 3.3.

18. The composition as claimed in claim 2, wherein the esterification product is the complete esterification product obtained by reacting the novolak type epoxy compound and the unsaturated monocarboxylic acid in a relative amount such that the ratio of the equivalent number of the epoxy group to that of the carboxyl group is in the range of 0.9 to 1.1.

19. The composition as claimed in claim 15, wherein the prepolymer is a reaction product of reacting the esterification product and the saturated or unsaturated polybasic acid anhydride, and the acid value of the produced resin is in the range of 30 to 160 mg KOH/g.

20. The composition as claimed in claim 19, wherein the prepolymer is a reaction product of reacting the esterification product and the saturated or unsaturated polybasic acid anhydride, and the acid value of the produced resin is in the range of 45 to 120 mg KOH/g.

21. The composition as claimed in claim 1, wherein the prepolymer is synthesized from styrene-maleic anhydride resin, an unsaturated compound containing an hydroxyl group and at least three acrylic groups and a saturated alcohol.

22. The composition as claimed in claim 21, wherein the saturated alcohol is substituted with $H_2O$.

23. The composition as claimed in claim 21, wherein the saturated alcohol is an alkyl alcohol.

24. The composition as claimed in claim 21, wherein the the saturated alcohol is an alcohol containing ether groups.

25. The composition as claimed in claim 23, wherein the alkyl alcohol is selected from the group consisting of ethanol, n-propanol, iso-propanol, n-butanol, sec-butanol, iso-butanol, n-pentanol, 2-methyl-1-butanol, isopentyl alcohol, n-hexyl alcohol, n-heptyl alcohol, n-octyl alcohol, cyclopentanol and cyclohexanol.

26. The composition as claimed in claim 24, wherein the saturated alcohol containing ether groups is selected from the group consisting of methyl cellosolve, ethyl cellosolve, butyl cellosolve, carbitol, propyleneglycol monomethylether and dipropyleneglycol monomethylether.

27. The composition as claimed in claim 21, wherein the equivalent ratio of the anhydride and the unsaturated compound is between 1:0.05 and 1:0.9.

28. The composition as claimed in claim 21, wherein the equivalent ratio of the anhydride and the unsaturated compound is between 1:0.2 and 1:0.7.

29. The composition as claimed in claim 21, wherein the equivalent ratio of the anhydride and the unsaturated compound is between 1:0.1 and 1:0.7.

30. The composition as claimed in claim 21, wherein the the styrene-maleic anhydride resin is synthesized by reacting styrene and maleic anhydride in a co-monomer ratio of between 3:1 and 1:3.

31. The composition as claimed in claim 21, wherein the molecular weight of the styrene-maleic anhydride is between 800 and 100000.

32. The composition as claimed in claim 21, wherein the the unsaturated compound contains a carboxylic group and three unsaturated acrylic acid group.

33. The composition as claimed in claim 21, wherein the unsaturated compound is pentaerythritol triacrylate.

34. The composition as claimed in claim 21, wherein the unsaturated compound contains a carboxylic group and five unsaturated acrylic acid group.

35. The composition as claimed in claim 21, wherein the unsaturated compound is pentaerythritol pentacrylate.

36. The composition as claimed in claim 1, wherein the composition further comprises a curing agent or curing promoter in an amount of 10 wt % of the composition.

37. The composition as claimed in claim 36, wherein the curing agent is dicyandiamide.

38. The composition as claimed in claim 36, wherein the curing agent is an imidazole compound.

39. The composition as claimed in claim 1, wherein the composition further comprising inorganic filler.

40. The composition as claimed in claim 1, wherein the composition further comprises an additive selected from the group consisting of coloring agent, polymerization inhibitor, thickening agent, anti-foaming agent, leveling agent and adhesion promotor.

41. The composition as claimed in claim 21, wherein the composition further comprises epoxy acrylate.

42. The composition as claimed in claim 41, wherein the epoxy acrylate is a reaction adduct of novolak epoxy compound and acrylic acid.

43. The composition as claimed in claim 42, wherein the novolak epoxy compound is cresol novolak epoxy compound.

* * * * *